(12) United States Patent
Kwack et al.

(10) Patent No.: US 8,419,494 B2
(45) Date of Patent: Apr. 16, 2013

(54) FLAT PANEL DISPLAY DEVICE AND METHOD OF MANUFACTURING THE SAME

(75) Inventors: Jin-Ho Kwack, Yongin (KR); Seung-Yong Song, Yongin (KR); Dong-Won Han, Yongin (KR); Jae-Ho Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/053,094

(22) Filed: Mar. 21, 2011

(65) Prior Publication Data
US 2012/0062104 A1 Mar. 15, 2012

(30) Foreign Application Priority Data
Sep. 14, 2010 (KR) .................. 10-2010-0089923

(51) Int. Cl.
*H01J 9/00* (2006.01)
(52) U.S. Cl.
USPC ............................................ 445/24; 118/720
(58) Field of Classification Search ............. 445/23–25; 118/720
See application file for complete search history.

(56) References Cited

U.S. PATENT DOCUMENTS
2006/0270305 A1* 11/2006 Imamura .................. 445/25
2009/0010100 A1  1/2009 Howard FOREIGN PATENT DOCUMENTS
| JP | 2001-237072 A | 8/2001 |
| KR | 20060006175 A | 1/2006 |
| KR | 20080105308 A | 12/2008 |

* cited by examiner

*Primary Examiner* — Ann Mai
*Assistant Examiner* — Andrew Coughlin
(74) *Attorney, Agent, or Firm* — Knobbe Martens Olson & Bear LLP

(57) ABSTRACT

A flat panel display device and a method of manufacturing the same. The method of manufacturing the flat panel display device includes: forming a display on a substrate; preparing an organic layer mask comprising a first mask body, a regulator extending from the first mask body and contacting the organic layer, and a tunnel having a space between the first mask body and the regulator; forming an organic layer covering the display in a region divided by the regulator of the organic layer mask, and condensing a part of the organic layer permeating through the tunnel; preparing an inorganic layer mask; and forming an inorganic layer covering the organic layers formed in the region divided by the regulator through the inorganic layer mask and in the tunnel.

5 Claims, 3 Drawing Sheets

FLAT PANEL DISPLAY DEVICE AND METHOD OF MANUFACTURING THE SAME

CROSS-REFERENCE TO RELATED APPLICATIONS

This application claims the benefit of Korean Patent Application No. 10-2010-0089923, filed on Sep. 14, 2010, in the Korean Intellectual Property Office, the disclosure of which is incorporated herein in its entirety by reference.

BACKGROUND

1. Field

The present disclosure relates to a flat panel display device having an improved encapsulation structure for preventing permeation of moisture from the outside and a method of manufacturing the flat panel display device.

2. Description of the Related Technology

Flat panel display devices such as organic light emitting display devices may have thin and flexible structures, and much research has been conducted into the further development thereof.

An organic light emitting display device generally includes a display that may deteriorate due to permeation of moisture, and thus, requires an encapsulation structure for sealing the display to prevent permeation of moisture from an external environment. In most typical encapsulation structures, a thin film encapsulation structure in which a display is covered by a multi-layer including an organic layer and an inorganic layer that are alternately stacked are used. That is, the organic layer and the inorganic layer are alternately stacked on the display of a substrate, thereby sealing the display.

In such structures, the organic layer applies flexibility to the flat panel display device, and the inorganic layer prevents permeation of oxygen or moisture from the outside. Accordingly, in order to prevent permeation of oxygen or moisture from the outside, the organic layer is disposed inside the flat panel display device to be adjacent to the display, and the inorganic layer is disposed outside the flat panel display device.

However, when stacking the organic and inorganic layers, an edge tail, which is an edge portion of the organic layer protruding more to the outside than an edge portion of the inorganic layer, may be generated. Generally, when the organic layer and the inorganic layer are formed, a mask may be put on a substrate so as to correspond to the corresponding layer in order to form a pattern in the layer. The organic layer permeates a gap between the mask and the substrate, thereby forming the edge tail. Oxygen or moisture permeates the display through the edge tail, thereby resulting in deterioration in performances of the flat panel display device.

Removal of the gap between the mask and the substrate, which the organic layer permeates, has been proposed, by scraping out a lower portion from among ends of the mask contacting a boundary portion of the organic layer, that is, a portion contacting the substrate in an eaves shape.

However, in this case, since the mask does not distinctly regulate the boundary portion of the organic layer, there is still a possibility that an edge tail is formed because an edge portion may flow out of the organic layer.

Accordingly, in order to form an encapsulation structure that can be protected against permeation of moisture and oxygen, there is a need to develop a method for suppressing formation of the edge tail of the organic layer.

SUMMARY OF CERTAIN INVENTIVE ASPECTS

The present disclosure provides a flat panel display device having an improved encapsulation structure capable of suppressing formation of an edge tail and a method of manufacturing the flat panel display device.

In one embodiment, there is provided a method of manufacturing a flat panel display device, the method including: forming a display on a substrate; preparing an organic layer mask including a first mask body, a regulator extending from the first mask body and contacting the organic layer, and a tunnel having a space between the first mask body and the regulator; forming an organic layer covering the display in a region divided by the regulator of the organic layer mask, and condensing a part of the organic layer permeating through the tunnel; preparing an inorganic layer mask; and forming an inorganic layer covering the organic layers formed in the region divided by the regulator through the inorganic layer mask and in the tunnel.

The organic layer formed by depositing a liquid monomer on the display and radiating UV light onto the deposited liquid monomer on the display so as to polymerize the liquid monomer.

The inorganic layer mask may include a second mask body and an eave unit extending from the second mask body in an eaves shape.

The organic layer is formed of a material selected from the group consisting of polyurea and polyacrylate.

The inorganic layer is formed of a material selected from the group consisting of SiNx, Al2O3, SiO2, and TiO2.

In another embodiment, there is provided a flat panel display device including: a substrate; a display formed on the substrate; an organic layer covering the display; an inorganic layer covering the organic layer, wherein a part of the organic layer is formed as a condensor so as to be separated from the display.

The organic layer is formed of a material selected from the group consisting of polyurea and polyacrylate.

The inorganic layer is formed of a material selected from the group consisting of $SiNx$, $Al_2O_3$, $SiO_2$, and $TiO_2$.

BRIEF DESCRIPTION OF THE DRAWINGS

The above and other features and advantages will become more apparent by describing in detail exemplary embodiments thereof with reference to the attached drawings in which.

DETAILED DESCRIPTION OF THE CERTAIN INVENTIVE EMBODIMENTS

Hereinafter, embodiments will be described in detail with reference to the attached drawings.

Figure 1:
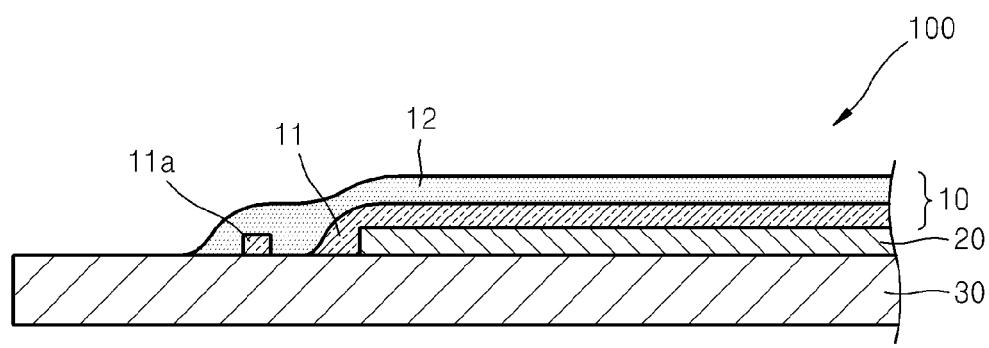
FIG. 1 is a cross-sectional view illustrating an embodiment of a flat panel display device.

FIG. 1 is a cross-sectional view illustrating an embodiment of a flat panel display device 100.

Referring to FIG. 1, the flat panel display device 100 includes a substrate 30, a display 20 that is formed on the substrate 30 and displays an image, and a thin film encapsulation layer 10 covering the display 20.

The thin film encapsulation layer 10 includes an organic layer 11 covering the display 20 and an inorganic layer 12 covering the organic layer 11. The organic layer 11 provides flexibility to the flat panel display device 100, and the inorganic layer 12 prevents permeation of oxygen or moisture.

The organic layer 11 may be formed of an organic material having flexibility, such as for example, polyurea, polyacrylate, or the like.

The inorganic layer 12 may be formed of an inorganic material having damp-proof property, such as for example, SiNx, Al2O3, SiO$_2$, TiO$_2$, or the like.

In some embodiments, part of the organic layer 11 may be formed as a condensor 11a so as to be separated from the display 20. The condensor 11a can be generated during a process for forming the organic layer 11 by using a distinctive organic layer mask 110 (see FIG. 2A). The condensor 11a substantially becomes an outer boundary of the organic layer 11, preventing the condensation in the organic layer 11 from flowing to the outside.

The inorganic layer 12 covers the condensor 11a and the entire organic layer 11 so as to prevent permeation of oxygen or moisture from the outside. The inorganic layer 12 covers the condensor 11a which is the outer boundary portion, and the organic layer 11 thus does not include a portion that is exposed to the outside, such as an existing edge tail. Water vapor transmission resistance may thus be greatly improved.

Embodiments of the flat panel display device having the above-described structure may be manufactured through embodiments of the following processes.

Figure 2A:
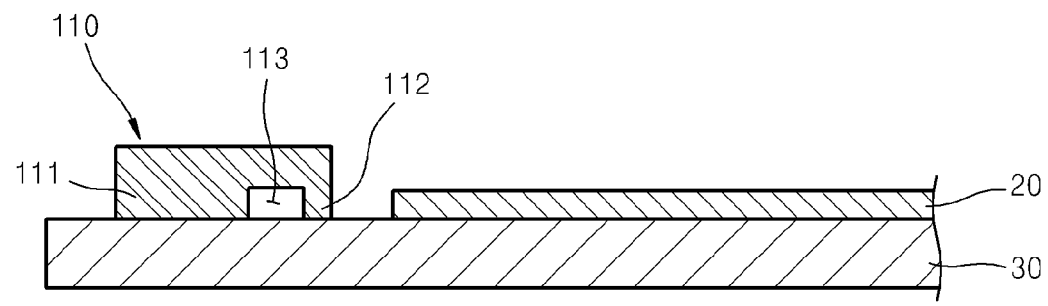
FIGS. 2A through 2D are cross-sectional views illustrating an embodiment of a process for manufacturing an embodiment of the flat panel display device of FIG. 1.

As illustrated in FIG. 2A, an organic layer mask 110 is formed on the substrate 30 on which the display 20 is formed. The organic layer mask 110 includes a first mask body 111, a regulator 112, and a tunnel 113. The regulator 112 extends from the first mask body 111 and contacts the organic layer 11 (not shown). The tunnel 113 is a space formed between the first mask body 111 and the regulator 112.

A material for forming the organic layer 11, such as a polymer such as polyurea or polyacrylate, is deposited. For ease of application, the polymer may be made as a liquid monomer 11' and then deposited. Ultra violet (UV) light may then be radiated onto the liquid monomer 11', thereby polymerizing the monomer to form a polymer.

Figure 2B:
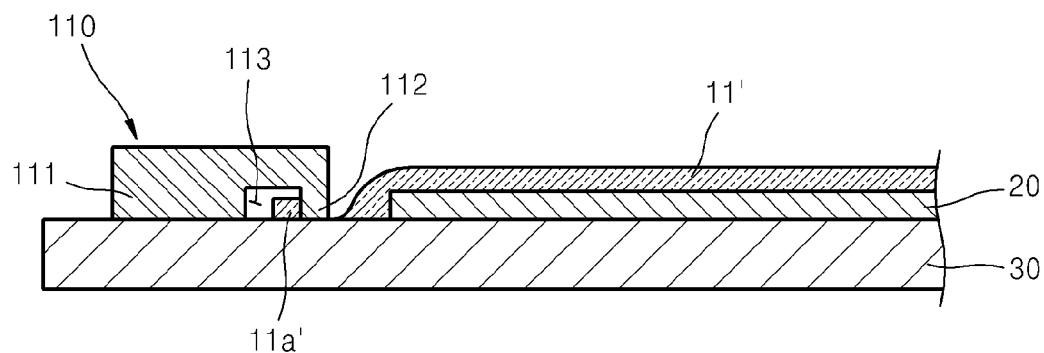

As illustrated in FIG. 2B, the liquid monomer 11' is deposited so as to cover the display 20. A part of the liquid monomer 11' may permeate between the regulator 112 and the substrate 30, thereby forming a condensor 11a' inside the tunnel 113. Without the tunnel 113 being formed, the liquid monomer 11' may escape to the outside via a minute gap between the substrate 30 and the organic layer mask 110 due to a capillary phenomenon. However, the liquid monomer 11' does not escape to the outside because of the tunnel 113 formed between the first mask body 111 and the regulator 112, and condenses therebetween. Thus, the condensor 11a' becomes an outermost boundary portion of the liquid monomer 11' when forming the organic layer 11, and the liquid monomer 11' does not escape to the outside.

Figure 2C:
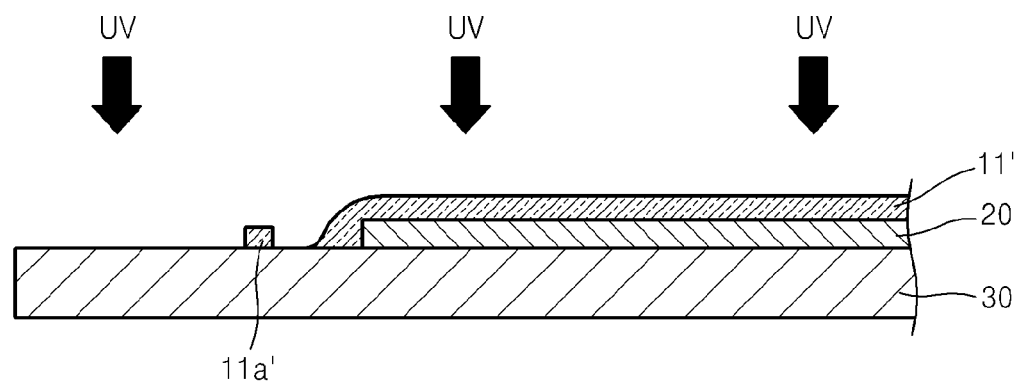

As illustrated in FIG. 2C, UV light is radiated onto the liquid monomer 11', the liquid monomer 11' is polymerized to form a polymer, thereby completing the organic layer 11. The condensor 11a' is also polymerized to form a polymer.

Figure 2D:
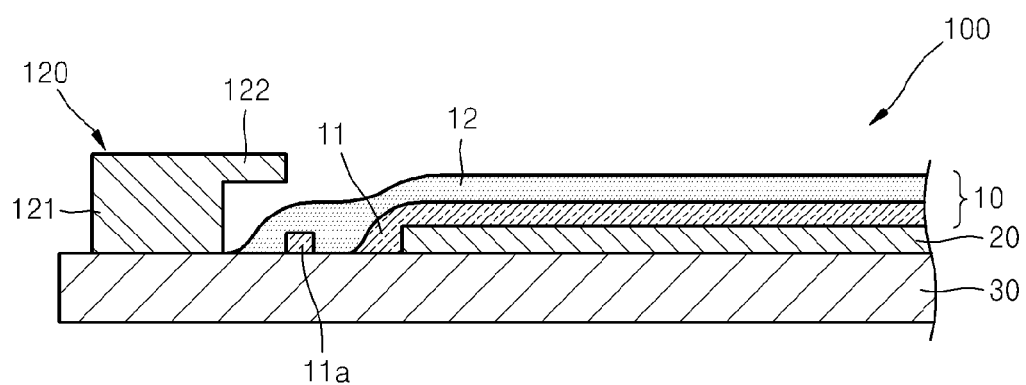

As illustrated in FIG. 2D, an inorganic layer mask 120 is formed on the substrate 30. The inorganic layer mask 120 includes a second mask body 121 and an eave unit 122 extending from the second mask body 121 in an eave shape. A lower portion of the eave unit 122 has a shape caved toward the second mask body 121, and thus the inorganic layer 12 may be formed over a wide region including the lower portion of the eave unit 122. The inorganic layer 12 is formed on the organic layer 11 by sputtering a material such as SiNx, Al2O3, SiO$_2$, or TiO$_2$ for forming the inorganic layer 12, through the inorganic layer mask 120. The inorganic layer 12 is formed up to the lower portion of the eaves unit 122, and thus covers the condensor 11a and the entire organic layer 11.

Accordingly, an outer portion of the thin film encapsulation layer 10 is covered by the inorganic layer 12 having an excellent damp proof property, and the organic layer 11 is not exposed to the outside, thereby realizing a thin film encapsulation layer 10 having an extremely stable water vapor transmission resistance.

An outer boundary of the organic layer 11 is distinctly distinguished up to the condensor 11a by using the organic layer mask 110, and then the condensor 11a and the entire organic layer 11 are covered by the inorganic layer 12, thereby alleviating the problem of an existing edge tail. A property deterioration problem of the display 20 due to permeation of oxygen or moisture may be remarkably improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a flat panel display device, the method comprising:
   forming a display on a substrate;
   placing an organic layer mask on the substrate, the organic layer mask comprising a first mask body, a regulator extending from the first mask body, and a tunnel having a space between the first mask body and the regulator;
   forming an organic layer covering the display, wherein a part of the material forming the organic layer passes between the substrate and the regulator and collects in the tunnel;
   preparing an inorganic layer mask; and
   forming an inorganic layer covering the organic layer.

2. The method of claim 1, wherein the organic layer is formed by depositing a liquid monomer on the display and radiating UV light onto the deposited liquid monomer on the display so as to polymerize the liquid monomer.

3. The method of claim 1, wherein the inorganic layer mask comprises a second mask body and an eave extending from the second mask body in an eave shape.

4. The method of claim 1, wherein the organic layer is formed of a material selected from the group consisting of polyurea and polyacrylate.

5. The method of claim 1, wherein the inorganic layer is formed of a material selected from the group consisting of SiNx, Al$_2$O$_3$, SiO$_2$, and TiO$_2$.

* * * * *